United States Patent [19]
Henmi

[11] Patent Number: 5,469,451
[45] Date of Patent: Nov. 21, 1995

[54] ERROR DETECTION AND CORRECTION OF A SEMICONDUCTOR MEMORY DEVICE

[75] Inventor: Toru Henmi, Tokyo, Japan

[73] Assignee: NEC Corporation, Tokyo, Japan

[21] Appl. No.: 347,220

[22] Filed: Nov. 23, 1994

Related U.S. Application Data

[63] Continuation of Ser. No. 782,121, Oct. 25, 1991, abandoned.

[30] Foreign Application Priority Data

Oct. 26, 1990 [JP] Japan .................. 2-288905

[51] Int. Cl.⁶ .................................................. H03M 13/00
[52] U.S. Cl. .................................... 371/40.4; 371/41
[58] Field of Search ........................ 371/40.1, 40.2, 371/40.4, 41, 38, 31

[56] References Cited

U.S. PATENT DOCUMENTS

| | | | |
|---|---|---|---|
| 4,225,959 | 11/1980 | Shelflow et al. | 371/38 |
| 4,249,253 | 2/1981 | Gentili et al. | 371/38 |
| 4,336,611 | 6/1982 | Bernhardt et al. | 371/38 |
| 4,633,471 | 12/1986 | Perera et al. | 371/38 |
| 4,800,563 | 1/1989 | Itagaki et al. | 371/13 |
| 4,802,117 | 1/1989 | Chrosny et al. | 364/900 |
| 5,063,565 | 11/1991 | Ohashi | 371/40.2 |
| 5,109,359 | 3/1992 | Sakakibara et al. | 365/189.07 |
| 5,239,656 | 8/1993 | Kawano | 395/800 |

Primary Examiner—Robert W. Beausoliel, Jr.
Assistant Examiner—Norman M. Wright
Attorney, Agent, or Firm—Sughrue, Mion, Zinn, Macpeak & Seas

[57] ABSTRACT

A semiconductor memory includes a main PROM for storing main data, a error correcting PROM for storing correcting data, a error correcting circuit for correcting the main data with the correcting data, and control register for supplying a control signal to the error correcting circuit. An error correction of the correcting circuit is halted during the debugging of a program by the control signal of "invalid".

4 Claims, 2 Drawing Sheets

5,469,451

ERROR DETECTION AND CORRECTION OF A SEMICONDUCTOR MEMORY DEVICE

This is a continuation of application Ser. No. 07/782,121 filed Oct. 25, 1991, now abandoned.

FIELD OF THE INVENTION

This invention relates to a semiconductor memory, and more particularly to, a semiconductor memory including a error correcting circuit.

BACKGROUND OF THE INVENTION

In a semiconductor memory employing a PROM (programmable ROM), there is a case in which incorrect data is read from the structure of the PROM, because the PROM lowers its ability to maintain correct information.

Accordingly, a conventional semiconductor memory used in a high reliability system includes, in addition to the PROM for storing main data, an error correcting PROM for storing correcting data calculated based on contents of the main data PROM (referred to as "main PROM" hereinafter).

In the conventional semiconductor memory, the main data is corrected in accordance with the correcting data when the main data is read from the main PROM, so that correct data is supplied from the memory.

However, if correcting data is not proper, for instance, the correcting data does not correspond to the main PROM because a content of the main PROM is changed, faulty data is supplied from the semiconductor memory. To prevent the supply of faulty data, the contents of the error correcting PROM is required to be changed in accordance with the change of the main PROM, when, for instance, a debugging of a program for the main PROM is carried out.

According to the conventional semiconductor memory, therefore, there is a disadvantage in that a content of the error correcting PROM is necessary to be changed at each time when a content of the main PROM is changed. This is a very troublesome procedure.

SUMMARY OF THE INVENTION

Accordingly, it is an object of the invention to provide a semiconductor memory from which correct data are read, even if an error correcting PROM is not changed in content to correspond to the change of the main PROM.

It is a further object of the invention to provide a semiconductor memory in which the necessity of changing a content of an error correcting PROM is obviated at the time of a program debugging.

According to the invention, a semiconductor memory includes:

a main PROM for storing main data;

an error correcting PROM for storing error correcting data;

an error correcting circuit for correcting the main data with the error correcting data; and means for controlling the error correcting circuit to correct the main data;

wherein the controlling means is supplied with a control data, so that an error correction of the error correcting circuit is halted, when the control data is invalid.

BRIEF DESCRIPTION OF THE DRAWINGS

The invention will be explained in more detail in conjunction with the appended drawings; wherein.

DESCRIPTION OF THE PREFERRED EMBODIMENTS

Figure 1:
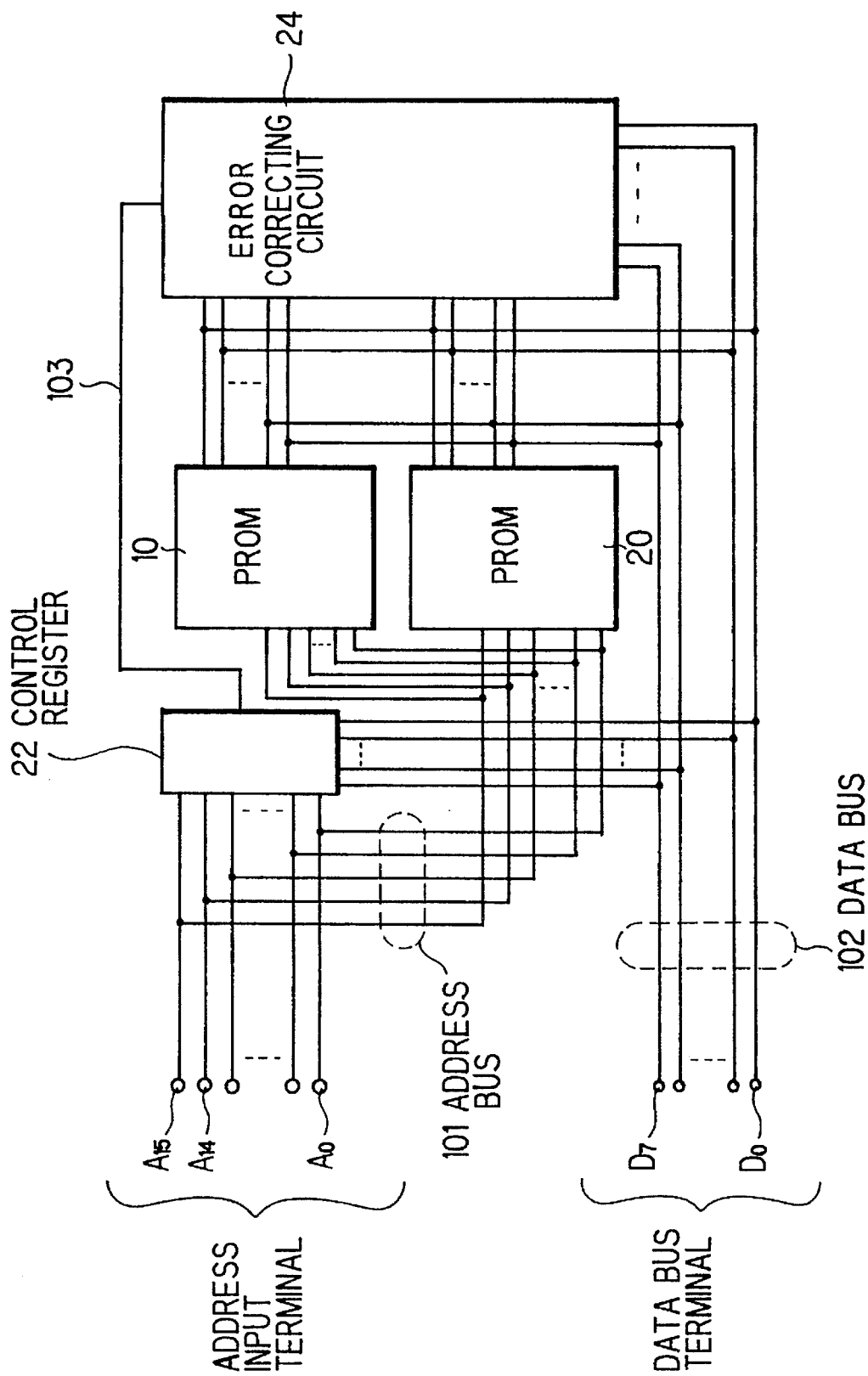
FIG. 1 is a block diagram showing a preferred embodiment according to the invention.

A semiconductor memory of a preferred embodiment shown in FIG. 1 includes a main PROM 10 for storing main data, a correcting PROM 20 for storing correcting data, an error correcting circuit 24 connected at inputs to the main and correcting PROMs 10 and 20, and at the output to the data bus terminals D0 to DT, and a control register 22 connected at output to the error correcting circuit 24.

The main PROM 10 has a capacity of 16K bytes, and is supplied with main data from the data bus terminals $D_0$ to $D_7$ through a data bus 102. The main PROM 10 is activated, when an address signal is supplied from address input terminals $A_0$ to $A_{15}$ thereto through an address bus 101. Here, it is assumed that an address of the main PROM 10 is "$000_H$" "$3FFF_H$" ($A_{14}=0$, $A_{15}=0$). The error correcting PROM 20 stores correcting data calculated based on contents of the main PROM 10. The control register 22 is supplied with correction control data, and supplies a control signal 10B to the error correcting circuit 22 in which it is determined as to whether error correcting operation should be carried out or not in accordance with the control signal 103.

Here, it is assumed that an address of the error correcting PROM 20 and the control register 22 is "$400_H$" to "$7FFF_H$" ($A_{14}=1$, $A_{15}=0$).

The error correcting circuit 24 is supplied with main and error correcting data from the main and error correcting PROMs 10 and 20, and corrects the main data in accordance with the error correcting data.

In writing operation, when an address signal of "$000_H$" to "$BFFF_H$" is supplied to the address input terminals $A_0$ to $A_{15}$, the main PROM 10 is activated by the address signal, so that main data supplied to the data bus terminals $D_0$ to $D_7$ is stored in the main PROM 10. After that, when an address signal of "$400_H$" to "$7FFF_H$" is supplied to the address input terminals $A_0$ to $A_{15}$, the error correcting PROM 20 and the control register 22 are activated. Thus, error correcting data is stored in the error correcting PROM 20, and error correction control data is supplied to the data bus terminals $D_0$ to $D_7$ and transferred to the control register 22.

In reading operation, when an address signal of "$000_H$" to "$3FFF_H$" is supplied to the main PROM 10, the main data is read therefrom to the error correcting circuit 24. After that, when an error address signal of "$400_H$" to "$7FFF_H$" is supplied to the error correcting PROM 20 and the control register 22, the correcting data stored in the error correcting PROM 20 is read therefrom to the error correcting circuit 22, and the control signal 103 is supplied from the control register 22 to the error correcting circuit 24. Then, the main data is corrected with the correcting data by the error correcting circuit 24, and is supplied to a following stage through the data bus terminals $D_0$ to $D_7$, when the error correction operation is instructed to be carried out by the control signal 103. On the other hand, when the error correction operation is instructed to be invalid by the control signal 103, the main data is supplied from the error correcting circuit 24 through the data bus terminals $D_0$ to $D_7$ to the following stage without any correction.

Figure 2:
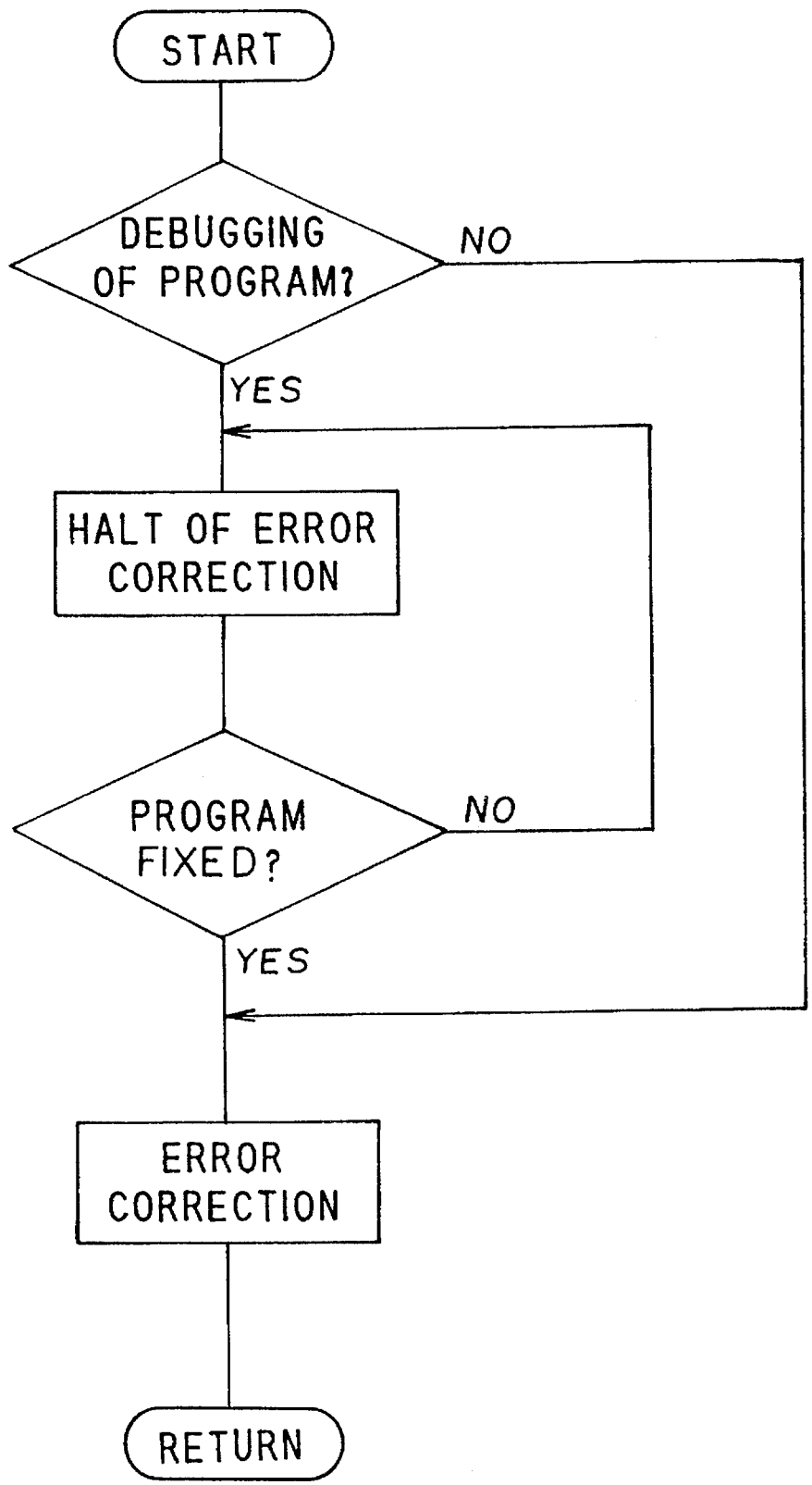
FIG. 2 is a flow chart explaining operation of the preferred embodiment.

FIG. 2 explains operation in the preferred embodiment. In this operation, when the debugging of a program to be stored in the main PROM 10 starts, the control signal 103 of "INVALID" is supplied to the error correction circuit 24, so that error correction is not carried out in the error correction circuit 22. When the program is finally fixed by the debugging operation, the control signal 103 of "VALID" is supplied to the error correction circuit 22, so that main data read from the main PROM 10 is corrected by error correcting data supplied from the error correcting PROM 20.

In this preferred embodiment, the main PROM 10 is addressed by an address signal supplied to the address terminals $A_0$ to $A_{13}$, and the error correcting PROM 20 and the control register 22 are addressed by address signals based on a content of the address terminal $A_{14}$, so that the error writing of data which may occur due to the error addressing is precisely avoided.

As described above, the error correction circuit 22 is controlled from an external circuit, so that the troublesome procedure of writing error correcting data at each time of modifying a program in the debugging of the program is obviated.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A semiconductor memory comprising:

a first PROM for storing first data;

a second PROM for storing second data;

an error correcting circuit, which when activated, corrects said first data with said second data and outputs corrected data, and which, when deactivated, outputs said first data uncorrected irrespective of whether or not said first data is in error;

a control register for receiving control data, for storing said control data, for responding to said control data stored therein and for outputting, in response to said control data, a control signal to control said error correcting circuit, said control signal being either a valid control signal or an invalid control signal, such that said error correcting circuit is activated when said control register is outputting said valid control signal, and said error correcting circuit is deactivated when said control register is outputting said invalid control signal.

2. A semiconductor memory according to claim 1, wherein said control data includes data indicating when a debugging operation of a program stored in said first PROM is being executed, and, when a debugging operation is being performed,, said control register outputs, in response to said control data, said invalid control signal so that said error correcting circuit does not operate, and when said debugging operation is completed, said control register outputs, in response to said control data, said valid control signal so that said error correcting circuit operates to correct said first data with said second data.

3. A semiconductor memory comprising:

a first PROM for storing first data;

a second PROM for storing second data;

an error correcting circuit for correcting said first data with said second data and outputting the corrected data when said error correcting circuit is activated, and outputting said first data uncorrected when said error correcting circuit is deactivated;

a control register for receiving control data, for storing said control data, for responding to said control data stored therein and for outputting, in response to said control data, a control signal;

a data bus, which includes at least one data bus terminal, commonly connected to said first PROM, said second PROM, said error correcting circuit, and said control register;

an address bus, a first portion of said address bus being assigned to said first PROM and a second portion of said address bus being assigned to said second PROM;

a control signal connection for supplying the control signal output by said control register to said error correcting circuit, the control signal being either a valid control signal or an invalid control signal, and the error correcting circuit being configured so that when said error correcting circuit receives the invalid control signal, said error detecting circuit is deactivated, and when said error detecting circuit receives the valid control signal, said error detecting circuit is activated.

4. A semiconductor memory as set forth in claim 3, wherein said control data includes data indicating when a debugging operation of a program stored in said first PROM is being executed, and, when a debugging operation is being performed, said control register outputs, in response to said control data, said invalid control signal so that said error correcting circuit does not operate, and when said debugging operation is completed, said control register outputs, in response to said control data, said valid control signal so that said error correcting circuit operates to correct said first data with said second data.

* * * * *

UNITED STATES PATENT AND TRADEMARK OFFICE
CERTIFICATE OF CORRECTION

PATENT NO.   : 5,469,451
DATED        : November 21, 1995
INVENTOR(S)  : Toru HENMI It is certified that error(s) appears in the above-identified patent and that said Letters Patent is hereby corrected as shown below:

Col. 1, line 18, delete "structure of the", insert before "PROM" (second occurrence) --structure of the--.

Col. 2, line 18, delete "DO to DT", insert --$D_0$ to $D_7$--.

Col. 2, line 30, delete "10B", insert --103--.

Col. 2, line 30, delete "22", insert --24--.

Col. 2, line 42, delete "$BFFF_H$", insert --$3FFF_H$--.

Col. 2, line 59 delete "22", insert --24--.

Col. 3, line 9, delete "22", insert --24--.

Col. 3, line 11, delete "22", insert --24--.

Col. 3, line 21, delete "22", insert --24--.

Signed and Sealed this

Twenty-fifth Day of June, 1996

Attest:

BRUCE LEHMAN

*Attesting Officer*   *Commissioner of Patents and Trademarks*